US010569380B2

(12) United States Patent
Nakamura

(10) Patent No.: US 10,569,380 B2
(45) Date of Patent: Feb. 25, 2020

(54) FILM THICKNESS SIGNAL PROCESSING APPARATUS, AND POLISHING APPARATUS

(71) Applicant: EBARA CORPORATION, Tokyo (JP)

(72) Inventor: Akira Nakamura, Tokyo (JP)

(73) Assignee: EBARA CORPORATION, Tokyo (JP)

(*) Notice: Subject to any disclaimer, the term of this patent is extended or adjusted under 35 U.S.C. 154(b) by 194 days.

(21) Appl. No.: 15/633,546

(22) Filed: Jun. 26, 2017

(65) Prior Publication Data

US 2018/0001437 A1 Jan. 4, 2018

(30) Foreign Application Priority Data

Jun. 29, 2016 (JP) ................................. 2016-128716

(51) Int. Cl.
B24B 37/005 (2012.01)
B24B 37/20 (2012.01)
G01B 7/06 (2006.01)
H01L 21/321 (2006.01)
B24B 49/10 (2006.01)
H01L 21/66 (2006.01)
H01L 21/768 (2006.01)

(52) U.S. Cl.
CPC ............ B24B 37/005 (2013.01); B24B 37/20 (2013.01); G01B 7/105 (2013.01); H01L 21/3212 (2013.01); H01L 22/26 (2013.01); B24B 49/105 (2013.01); H01L 21/7684 (2013.01)

(58) Field of Classification Search
CPC ..... B24B 37/005; B24B 37/20; B24B 49/105; G01B 7/105; H01L 21/3212; H01L 21/7684; H01L 22/26
See application file for complete search history.

(56) References Cited

U.S. PATENT DOCUMENTS

| 6,949,007 B1* | 9/2005 | Wang .................... B24B 37/013 257/509 |
| 9,437,507 B2* | 9/2016 | Nakamura .............. H01L 22/26 |
| 9,555,517 B2* | 1/2017 | Takahashi ............... H01L 22/14 |
| 10,160,089 B2* | 12/2018 | Nakamura ............ B24B 37/013 |
| 10,256,111 B2* | 4/2019 | Lau ......................... G01B 11/03 |
| 2005/0245169 A1* | 11/2005 | Morisawa ............. B24B 37/042 451/5 |
| 2007/0103150 A1* | 5/2007 | Tada ...................... G01B 7/105 324/229 |
| 2007/0239309 A1* | 10/2007 | Tada ..................... B24B 37/005 700/121 |
| 2008/0139087 A1 | 6/2008 | Togawa et al. |

(Continued)

FOREIGN PATENT DOCUMENTS

JP 2005-011977 A 1/2005
JP 2005-121616 A 5/2005

Primary Examiner — Timothy V Eley
(74) Attorney, Agent, or Firm — BakerHostetler

(57) ABSTRACT

A receiving unit receives sensor data output from an eddy current sensor for detecting the film thickness of a polishing object to generate film thickness data. A correcting unit corrects the film thickness data in an inside of the edge of the polishing object based on the film thickness data generated by the receiving unit. The correcting unit corrects the film thickness data generated by the receiving unit in the inside of the edge of the polishing object using the film thickness data generated by the receiving unit in an outside of the edge of the polishing object.

4 Claims, 6 Drawing Sheets

(56) References Cited

U.S. PATENT DOCUMENTS

2008/0268751 A1* 10/2008 Yokoyama ............ B24B 37/005
          451/5
2010/0112901 A1   5/2010 Togawa et al.
2012/0164917 A1*  6/2012 Kobata ................ B24B 37/005
          451/6
2013/0065493 A1*  3/2013 Takahashi ............ B24B 37/013
          451/59

* cited by examiner

FILM THICKNESS SIGNAL PROCESSING APPARATUS, AND POLISHING APPARATUS

CROSS-REFERENCE TO RELATED APPLICATION

This application is based upon and claims the benefit of priority of the prior Japanese Patent Application No. 2016-128716, filed on Jun. 29, 2016, the entire content of which is incorporated herein by reference.

BACKGROUND OF THE INVENTION

Field of the Invention

The present invention relates to a film thickness signal processing apparatus, a polishing apparatus, a film thickness signal processing method, and a polishing method.

Description of the Related Art

In recent years, the wiring lines of circuits have become increasingly fine and the number of layers of multilayer interconnection has increased due to the high integration and densification of semiconductor devices. In order to realize multilayer interconnection while attempting to miniaturize circuits, surfaces of semiconductor devices have to be planarization-processed with high accuracy.

Chemical-mechanical polishing (CMP) is known as a technique to planarize a surface of a semiconductor device. A polishing apparatus used to perform CMP is provided with a polishing table to which a polishing pad is attached, and a top ring for holding a polishing object (for example, a substrate, such as a semiconductor wafer, or various films formed on a surface of the substrate). The polishing apparatus polishes the polishing object by pressing the polishing object held on the top ring against the polishing pad while rotating the polishing table.

The polishing apparatus is provided with a film thickness measuring apparatus to detect the endpoint of a polishing process based on the film thickness of the polishing object. The film thickness measuring apparatus is provided with a film thickness sensor for detecting the film thickness of the polishing object. Examples of the film thickness sensor typically include an eddy current sensor and an optical sensor.

The eddy current sensor or the optical sensor is disposed in a hole formed in the polishing table and detects a film thickness when facing the polishing object, while revolving along with the rotation of the polishing table. The eddy current sensor induces an eddy current in the polishing object, such as a conductive film, and detects a change in the thickness of the polishing object from a change in a magnetic field caused by the eddy current induced in the polishing object. On the other hand, the optical sensor radiates light to the polishing object and measures an interference wave reflected from the polishing object, thereby detecting the thickness of the polishing object.

Incidentally, the film thickness sensor detects a film thickness while relatively moving along a surface to be polished of the polishing object along with the rotation of the polishing table. On the other hand, a magnetic field or light that the film thickness sensor uses to detect a film thickness has a spot diameter. Accordingly, in order for the output of the film thickness sensor to reach approximately 100%, the entire range of the spot diameter has to be inside the edge of the polishing object. That is, the entire range of the spot diameter of the film thickness sensor is inside the edge of the polishing object under the condition of the film thickness sensor facing the central part of the surface to be polished of the polishing object, and therefore, the output of the film thickness sensor is approximately 100%. On the other hand, only part of the spot diameter of the film thickness sensor is inside the edge of the polishing object under the condition of the film thickness sensor facing an edge part of the polishing object, and therefore, the output of the film thickness sensor does not reach 100%.

The related art is known to perform so-called edge cut processing in which processing is performed by discarding the output of the film thickness sensor in locations where the output of the film thickness sensor does not reach approximately 100%. Since the related art performs the edge cut processing, the film thickness cannot be correctly measured at edge parts.

That is, the related art performs so-called edge cut processing in locations where the output of the film thickness sensor does not reach approximately 100%. It is therefore difficult to detect a film thickness with high accuracy at edge parts of the polishing object.

In recent years, there is a request to measure the film thickness to a position nearer to an edge of a semiconductor wafer and control the film thickness with an in-situ closed loop control to reduce a defective product rate near the edge of the semiconductor wafer.

Hence, it is an object of the present invention to reduce a defective product rate near an edge of a polishing object by improving the accuracy of detecting the film thickness at the edge.

SUMMARY OF THE INVENTION

To achieve the above-described object, in a first embodiment, a film thickness signal processing apparatus includes: a receiving unit for receiving sensor data output from a film thickness sensor for detecting a film thickness of a polishing object to generate film thickness data; and a correcting unit for correcting the film thickness data in an inside of the edge of the polishing object based on the film thickness data generated by the receiving unit, the correcting unit correcting the film thickness data generated by the receiving unit in the inside of the edge of the polishing object using the film thickness data generated by the receiving unit in an outside of the edge of the polishing object.

According to the present embodiment, the accuracy of detecting the film thickness at the edge of the polishing object is improved to thereby reduce the defective product rate near the edge.

When the film thickness sensor is located in the vicinity of and inside the edge, a part of a spot diameter is located outside the edge. Since the magnitude of the sensor data is attenuated at this time, the sensor data output from the film thickness sensor in the inside of the edge is corrected using the sensor data output from the film thickness sensor in the outside of the edge. As a result, the film thickness can be measured to a position nearer to the edge. That is, an effective range of the sensor is widened at the edge to thereby improve the accuracy of detecting the film thickness at the edge of the polishing object.

In a second embodiment, a film thickness signal processing apparatus includes an estimating unit for estimating a position of the edge of the polishing object based on film thickness data generated by the receiving unit, the correcting unit correcting the film thickness data using the estimated position of the edge.

Conventionally, the position of the edge is checked based on a sensor output value by checking the sensor output value at the edge position in advance, for example. In the present embodiment, it is not necessary to check the edge position in advance before starting polishing because the position of the edge is estimated based on the generated film thickness data.

The edge position of a metal film may be displaced by each lot of the polishing object. In the present embodiment, the position of the edge can be estimated based on the film thickness data generated by each lot to thereby measure the film thickness to a position near the edge more accurately without influence of the lot.

In a film thickness signal processing apparatus in a third embodiment, the correcting unit performs the correction by adding the film thickness data generated by the receiving unit at a position that is located at a first distance outward from the edge to the film thickness data generated by the receiving unit at a position that is located at a second distance inward from the edge, the first distance and the second distance being equal to each other.

In a fourth embodiment, a polishing apparatus includes: a polishing table to which a polishing pad for polishing a polishing object is attachable; a driving unit capable of rotary-driving the polishing table; a holding unit capable of holding and pressing the polishing object against the polishing pad; a film thickness sensor disposed in a hole formed in the polishing table and capable of detecting the film thickness of the polishing object along with the rotation of the polishing table; and any one of the film thickness signal processing apparatuses in the first to third embodiments.

In a fifth embodiment, a film thickness signal processing method includes: receiving sensor data output from a film thickness sensor for detecting a film thickness of a polishing object to generate the film thickness data; and correcting the film thickness data in the inside of the edge of the polishing object based on the generated film thickness data. The correcting is performed by correcting the generated film thickness data in the inside of the edge of the polishing object using the generated film thickness data in the outside of the edge of the polishing object.

In a sixth embodiment, a polishing method includes: receiving film thickness data output from a film thickness sensor for detecting a film thickness of a polishing object to generate the film thickness data; correcting the film thickness data in the inside of the edge of the polishing object based on the generated film thickness data; and controlling a pressing force of the polishing object based on the corrected film thickness data. The correcting is performed by correcting the generated film thickness data in the inside of the edge of the polishing object using the generated film thickness data in the outside of the edge of the polishing object.

DETAILED DESCRIPTION OF THE PREFERRED EMBODIMENTS

Hereinafter, a film thickness signal processing apparatus, a polishing apparatus, a film thickness signal processing method, and a polishing method according to one embodiment of the present invention will be described with reference to the accompanying drawings.

Figure 1:
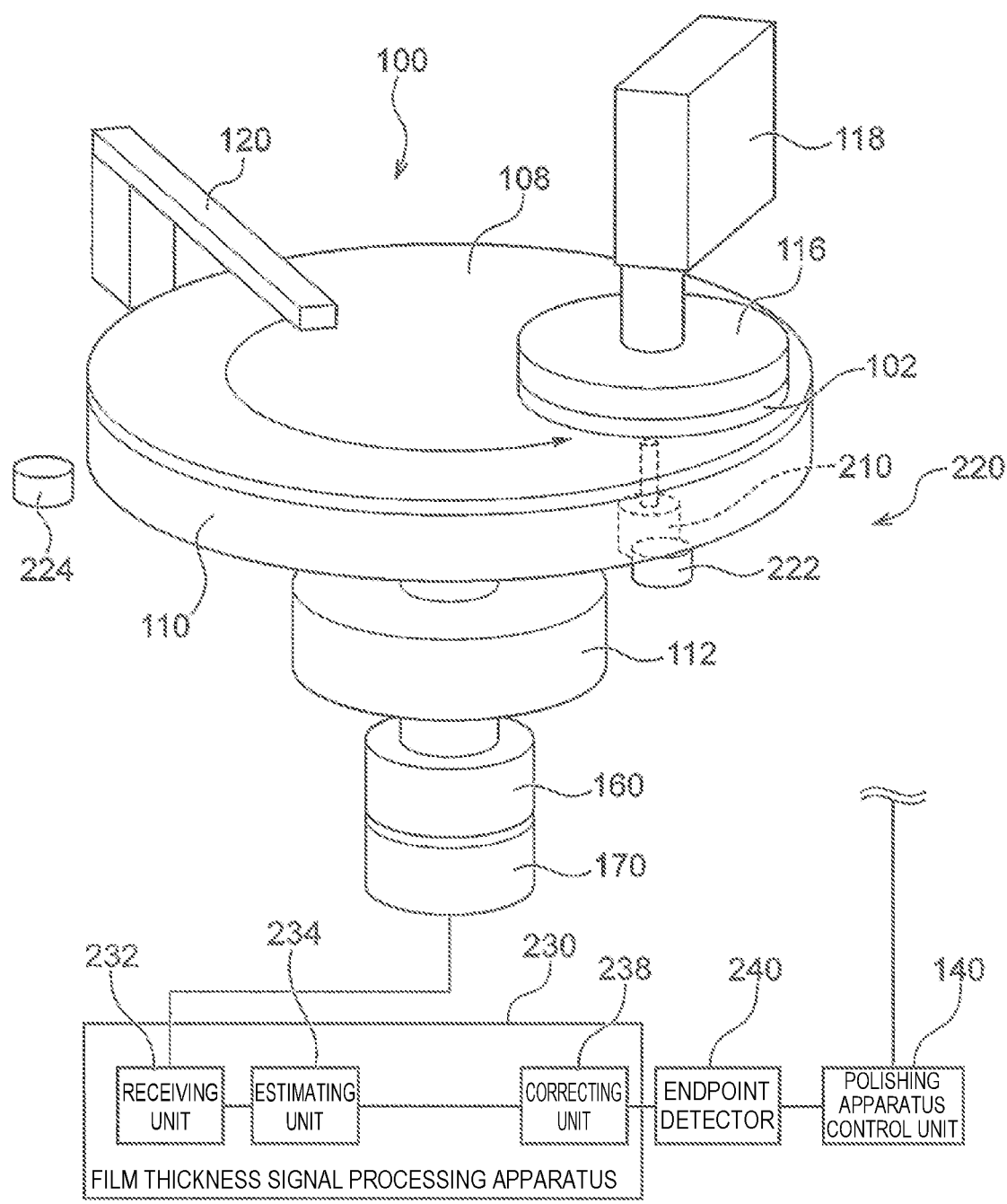
FIG. 1 is a diagram schematically illustrating the overall configuration of a polishing apparatus.

FIG. 1 is a drawing schematically illustrating the overall configuration of a polishing apparatus of one embodiment of the present invention. As illustrated in FIG. 1, a polishing apparatus 100 is provided with a polishing table 110 to an upper surface of which a polishing pad 108 used to polish a polishing object (for example, a substrate, such as a semiconductor wafer, or various films formed on a surface of the substrate) 102 is attachable; a first electromotive motor (driving unit) 112 for rotary-driving the polishing table 110; a top ring (holding unit) 116 capable of holding the polishing object 102; and a second electromotive motor (driving unit) 118 for rotary-driving the top ring 116.

The polishing apparatus 100 is provided with a slurry line 120 for supplying an abrasive liquid containing a polishing agent to the upper surface of the polishing pad 108. The polishing apparatus 100 is provided with a polishing apparatus control unit 140 for outputting various control signals related to the polishing apparatus 100.

The polishing apparatus 100 is provided with an eddy current sensor 210 disposed in a hole formed in the polishing table 110 to detect the film thickness of the polishing object 102 along a surface to be polished thereof along with the rotation of the polishing table 110. The polishing apparatus 100 is also provided with a trigger sensor 220 including a proximity sensor 222 disposed on the polishing table 110 and a dog 224 disposed outside the polishing table 110.

The eddy current sensor 210 is provided with an excitation coil, a detection coil and a balance coil. The excitation coil is excited by an AC current supplied from an AC power line to form an eddy current in the polishing object 102 located in the vicinity of the excitation coil. A magnetic flux generated by the eddy current formed in the polishing object 102 interlinks with the detection coil and the balance coil. Since the detection coil is located in a position closer to a conductive film than the position of the balance coil, the balance between inductive voltages arising in the two coils becomes disrupted. Consequently, the eddy current sensor 210 detects an interlinkage magnetic flux formed by the eddy current of the polishing object, thereby detecting the thickness of the polishing object based on the detected interlinkage magnetic flux. Note that although an example is shown here in which the eddy current sensor 210 is arranged, the first embodiment is not limited to this example. Alternatively, there may be arranged an optical sensor for radiating light to the polishing object to measure an interference wave reflected from the polishing object, thereby detecting the thickness of the polishing object.

Figure 2:
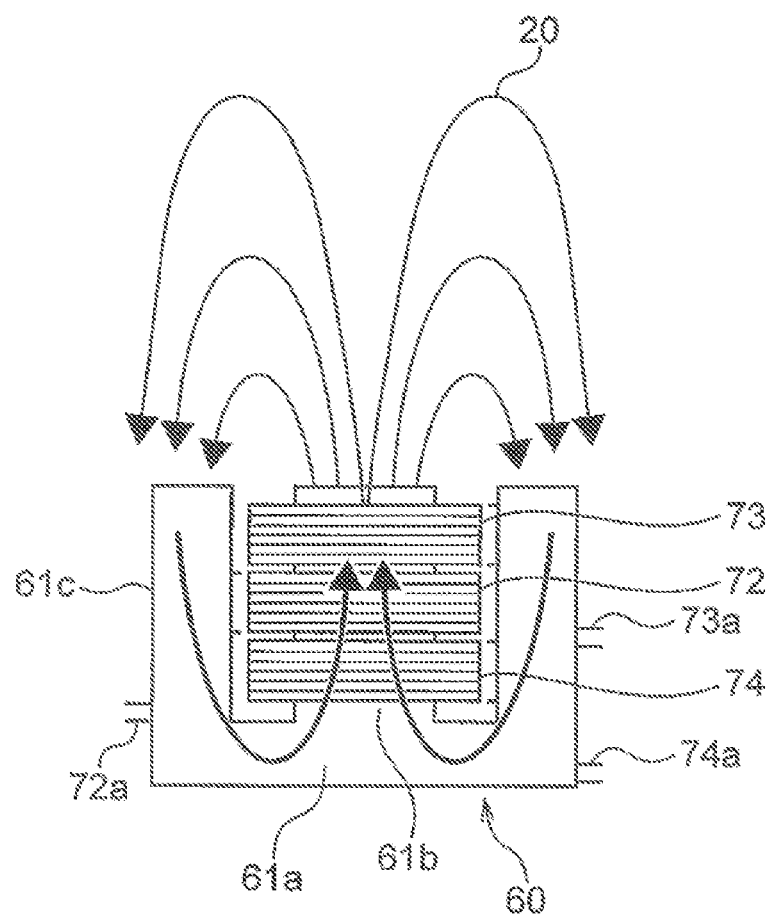
FIG. 2 is a schematic diagram illustrating a configuration example of an eddy current sensor 210 of the present embodiment.

FIG. 2 is a schematic diagram illustrating a configuration example of the eddy current sensor 210 of the present embodiment. As illustrated in FIG. 2, the eddy current sensor 210 includes: a pot core 60; and three coils 72, 73, 74.

The pot core 60 which is a magnetic body includes: a bottom surface part 61a; a magnetic core 61b provided at a center of the bottom surface part 61a; and a peripheral wall part 61c provided around the bottom surface part 61a.

The center coil 72 among the three coils 72, 73, 74 is an excitation coil which is connected to an AC signal source. The excitation coil 72 forms an eddy current in a metal film (or a conductive film) on the polishing object 102 located in the vicinity of the excitation coil by a magnetic field which is produced by a voltage supplied from the AC signal source. The detection coil 73 is disposed at the metal film (or the conductive film) side of the excitation coil 72, and detects a magnetic field produced by the eddy current formed in the metal film (or the conductive film). The balance coil 74 is disposed at the opposite side of the detection coil 73 across the excitation coil 72. The balance coil 74 is for adjusting a balance by a resistance bridge circuit which is used for detecting the magnetic field produced by the eddy circuit. The balance coil 74 is operable to adjust a zero point. Thus, an eddy current flowing through the metal film (or the conductive film) can be detected from zero, so that the detection sensitivity of an eddy current flowing through the metal film (or the conductive film) can be enhanced. The excitation coil 72 is disposed at the magnetic core 61b and produces an eddy current in the conductive film. The detection coil 73 is disposed at the magnetic core 61b and detects the eddy current produced in the conductive film. It is understood that since magnetic fluxes 20 generated in the eddy current sensor 210 are concentrated, the spread of the magnetic fluxes 20 is narrower than the spread of the magnetic fluxes generated in the conventional eddy current sensor using a conventional solenoid coil.

When the film thickness of the metal film (or the conductive film) changes, the eddy current changes, and thereby the impedances of the detection coil 73 and the balance coil 74 change. The eddy current sensor 210 in the present embodiment detects the change of the film thickness of the metal film (or the conductive film) from the impedance change. A receiving unit 232 detects the impedance from the sensor data output from the eddy current sensor 210. When the impedance changes, the eddy current sensor can detect the change of the film thickness of the metal film (or the conductive film).

The receiving unit 232 calculates a difference between the detected impedance and an impedance when the film thickness is "zero," and outputs a square of an absolute value of the difference as film thickness data. The impedance when the film thickness is "zero" is measured in advance. The difference is calculated such that the film thickness data becomes "zero" when the film thickness is "zero." The square of the absolute value of the difference is output as the film thickness data such that a correcting unit 238 corrects the film thickness data in consideration of an effective amount and a loss amount of energy, as described later, because the square of the absolute value of the impedance is considered as an amount corresponding to the energy.

The proximity sensor 222 is attached to the lower surface (a surface to which the polishing pad 108 is not attached) of the polishing table 110. The dog 224 is disposed outside the polishing table 110, so as to be detected by the proximity sensor 222. The trigger sensor 220 outputs a trigger signal indicating that the polishing table 110 has rotated one revolution, based on the positional relationship between the proximity sensor 222 and the dog 224. Specifically, the trigger sensor 220 outputs the trigger signal under the condition that the proximity sensor 222 and the dog 224 are closest to each other.

The eddy current sensor 210 is controlled, in terms of the time to start measurement and the time to end measurement, based on the trigger signal output from the trigger sensor 220. For example, a time point after a lapse of a predetermined period of time from when a trigger signal is output from the trigger sensor 220 is defined as the time for the eddy current sensor 210 to start measurement. Likewise, a time point after a lapse of a predetermined period of time from when a trigger signal is output from the trigger sensor 220 is defined as the time for the eddy current sensor 210 to end measurement. Assume here that the predetermined periods of time are previously set as parameters.

When polishing the polishing object 102, the polishing apparatus 100 supplies polishing slurry containing polishing abrasive grains from the slurry line 120 to the upper surface of the polishing pad 108 and rotary-drives the polishing table 110 using the first electromotive motor 112. Then, the polishing apparatus 100 presses the polishing object 102 held on the top ring 116 against the polishing pad 108, while rotating the top ring 116 around a rotational axis decentered from the rotational axis of the polishing table 110. Consequently, the polishing object 102 is polished and planarized by the polishing pad 108 retaining the polishing slurry.

Next, a film thickness signal processing apparatus 230 will be described. As illustrated in FIG. 1, the film thickness signal processing apparatus 230 is connected to the eddy current sensor 210 through rotary joint connectors 160 and 170. The film thickness signal processing apparatus 230 performs predetermined signal processing on sensor data output from the eddy current sensor 210, and then outputs the sensor data to an endpoint detector 240.

The endpoint detector 240 monitors a change in the film thickness of the polishing object 102 based on a signal output from the film thickness signal processing apparatus 230. The endpoint detector 240 is connected to a polishing apparatus control unit 140 for performing various types of control related to the polishing apparatus 100. Upon detection of the polishing endpoint of the polishing object 102, the endpoint detector 240 outputs a signal to that effect to the polishing apparatus control unit 140. Upon receipt of the signal indicating a polishing endpoint from the endpoint detector 240, the polishing apparatus control unit 140 finishes polishing by the polishing apparatus 100. The polishing apparatus control unit 140 controls a pressing force of the polishing object 102 based on the corrected film thickness data during polishing.

The film thickness signal processing apparatus 230 includes: a receiving unit 232, an estimating unit 234, and a correcting unit 238.

The receiving unit 232 receives sensor data output from the eddy current sensor 210, and generates the film thickness data.

The estimating unit 234 estimates a position of an edge of the polishing object 102 based on film thickness differences among a plurality of adjacent points of the film thickness data generated by the receiving unit 232, for example. The estimating unit 234 can generate edge-detecting waveforms by calculating the film thickness differences among the plurality of adjacent points of the film thickness data.

For example, assume that the film thickness data values of the plurality of adjacent points (three points) are f(i−1), f(i), and f(i+1). Then, calculation values F(i), F(i+1) based on differences at points i, i+1 on the polishing object 102 are represented as F(i)={(f(i−1)−f(i))}, F(i+1)={(f(i)−f(i+1))}, respectively. A position of peak appearing in the edge-detecting waveform (F(i)) thus obtained at each point on the polishing object 102 is defined as a position of an edge of the film thickness data. This calculation corresponds to differentiating the film thickness data. Note that in the present embodiment, an example is shown in which the edge-detecting waveforms are generated by multiplying by film thickness differences among a plurality of adjacent points. The present embodiment is not limited to this example, however. It is possible to perform other computations, such as a computation using a Sobel filter.

The correcting unit 238 corrects the film thickness data in the inside of the edge of the polishing object 102 based on the film thickness data generated by the receiving unit 232. Note that in the present embodiment, the correcting unit 238 also corrects the film thickness data in the outside of the edge of the polishing object 102 based on the film thickness data generated by the receiving unit 232. The correcting unit 238 corrects the film thickness data generated by the receiving unit 232 in the inside of the edge of the polishing object 102 using the film thickness data generated by the receiving unit 232 in the outside of the edge of the polishing object 102. The correcting unit 238 performs the correction by adding the film thickness data generated by the receiving unit 232 at a position that is located at a first distance outward from the edge to the film thickness data generated by the receiving unit 232 at a position that is located at a second distance inward from the edge. The first distance and the second distance are equal to each other.

The correcting unit 238 may output the film thickness data indicating the squared value of impedance to an endpoint detector 240 as it is, or may convert the film thickness data into an actual film thickness to output the actual film thickness, because an endpoint can be detected and a film thickness can be controlled by the film thickness data indicating the squared value of impedance. There are various methods of converting the impedance into a film thickness value. There is a method of measuring a relationship between the impedance and the film thickness in advance and storing it as a conversion table in the polishing apparatus control unit 140. Also, the impedance may be converted into the film thickness value according to a formula representing the relationship between the impedance and the film thickness which is obtained theoretically.

Figure 3A:
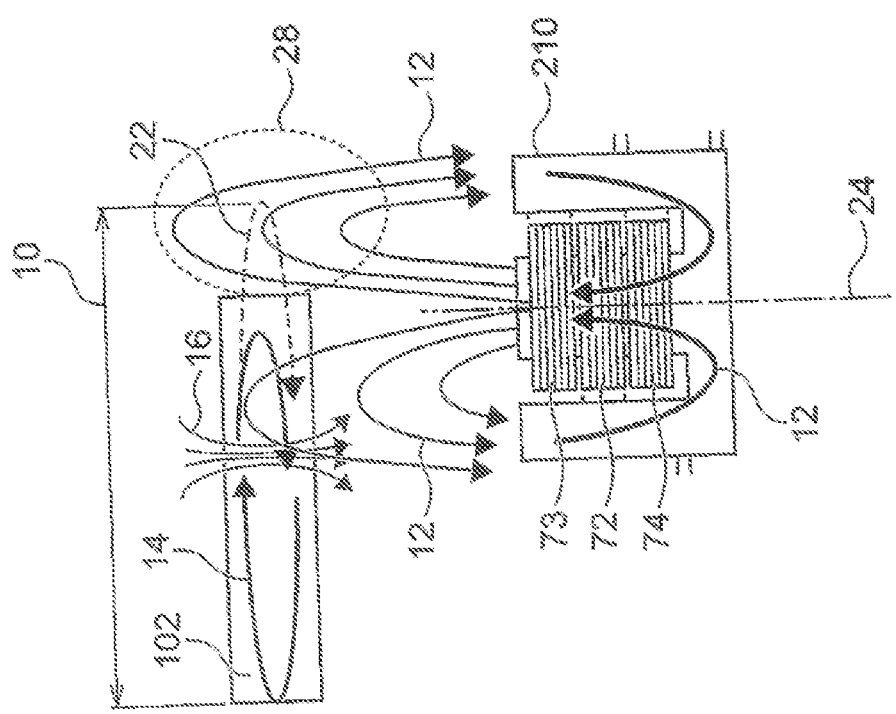
FIGS. 3A and 3B are diagrams illustrating magnetic flux states where an entire spot diameter 10 of the eddy current sensor 210 is inside a polishing object 102 and where a part of the spot diameter 10 is outside the polishing object 102, respectively.
Figure 3B:
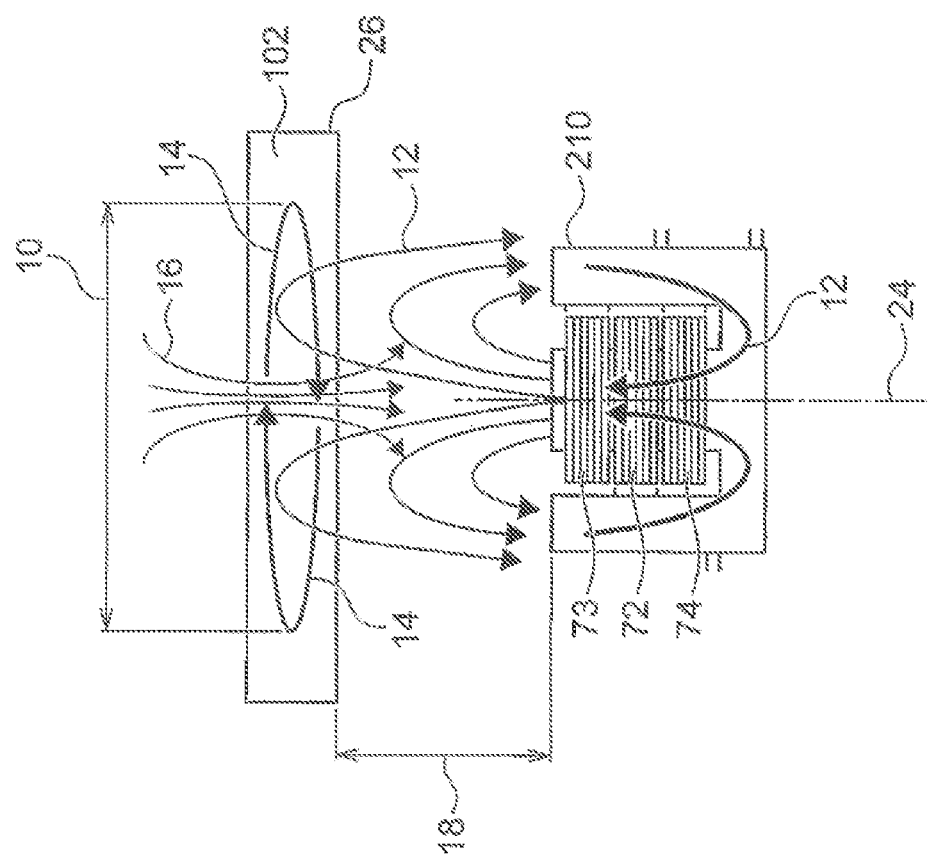

In the present embodiment, some reasons to perform such corrections are described with reference to FIG. 3 to FIG. 5. FIG. 3 illustrates a magnetic flux state where the entire spot diameter 10 of the eddy current sensor 210 is inside the polishing object 102 and a magnetic flux state where a part of the spot diameter 10 is outside the polishing object 102. FIG. 3A is a diagram illustrating the magnetic flux state where the entire spot diameter 10 of the eddy current sensor 210 is inside the polishing object 102. FIG. 3B is a diagram illustrating the magnetic flux state where a center 24 of the eddy current sensor 210 is aligned with the edge 26 of the polishing object 102 and a part of the spot diameter 10 is outside the polishing object 102.

In FIG. 3, an eddy current 14 is produced in the polishing object 102 by the magnetic flux 12 produced by the excitation coil 72. An induced magnetic field 16 is produced by the eddy current 14, and the induced magnetic field 16 is detected by the detection coil 73 and the balance coil 74. The spot diameter 10 is an outer diameter of the eddy current 14 produced when the eddy current sensor 210 is sufficiently inside the polishing object 102, the eddy current 14 having the magnitude which is equal to or larger than a prescribed value.

In FIG. 3A, the entire magnetic flux 12 produced by the excitation coil 72 is in the polishing object 102 which is located at a distance 18 or more away from the eddy current sensor 210. Thus, the eddy current 14 is effectively produced by the magnetic flux 12. On the other hand, in FIG. 3B, only a part of the magnetic flux 12 produced is in the polishing object 102 which is located at a distance 18 or more away from the eddy current sensor 210. Therefore, a part of the magnetic flux 12 does not contribute to production of the eddy current 14. Since the eddy current 14 is produced only in the polishing object 102, the eddy current 14 is weakened, and the induced magnetic field 16 is also weakened. As a result, the outputs of the detection coil 73 and the balance coil 74 are reduced.

In the present embodiment, such an output reduction is corrected. When the eddy current sensor 210 is located inside the edge 26 to face the polishing object 102, it is desirable that the same output value as those in the case of FIG. 3A can be obtained even when the eddy current sensor 210 is inside near the edge 26 or inside at a distance from the edge 26, because it is desirable that the output values of the eddy current sensor 210 are the same because almost the same film thickness values are obtained even when the eddy current sensor 210 is located near the edge 26 and at a distance from the edge 26 in the inside of the edge 26. In the present embodiment, the correction is performed so that the output values of the eddy current sensor 210 are almost the same values even when the eddy current sensor 210 is located near the edge 26 or at a distance from the edge 26 as long as the eddy current sensor 210 is inside the edge 26. Note that in the present embodiment, the position of the eddy current sensor 210 means a position of the center 24 of the eddy current sensor 210.

In the case of FIG. 3B, the magnetic fluxes of about half of the available magnetic fluxes 12 are outside the polishing object 102. The magnetic fluxes surrounded by a dot line 28 are not in contact with the polishing object 102. An eddy current 22 indicated by a dot line which does not actually exist is drawn for comparing with the eddy current 14 in FIG. 3A. The eddy current 22 is considered as an eddy current which is not effectively used. In the present embodiment, a loss corresponding to the eddy current 22 is evaluated and corrected.

Figure 4A:
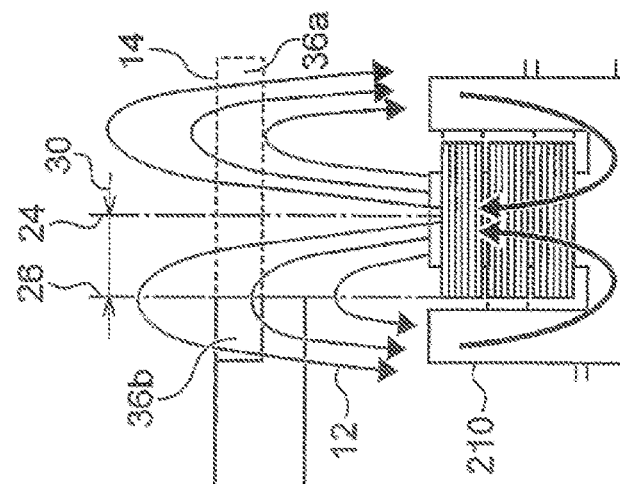
FIGS. 4A, 4B, and 4C are diagrams used to describe correction amounts.
Figure 4B:
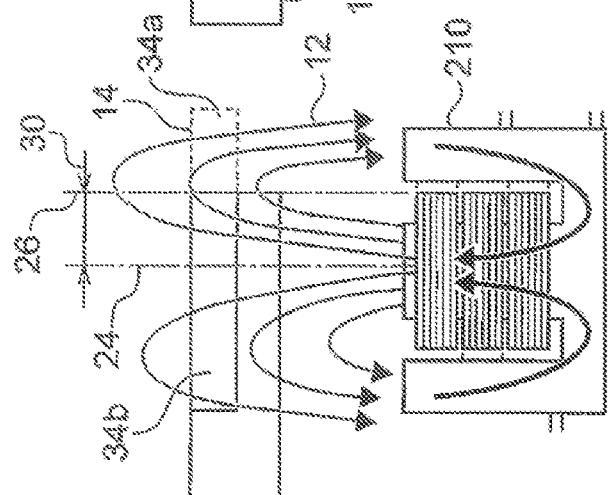
Figure 4C:
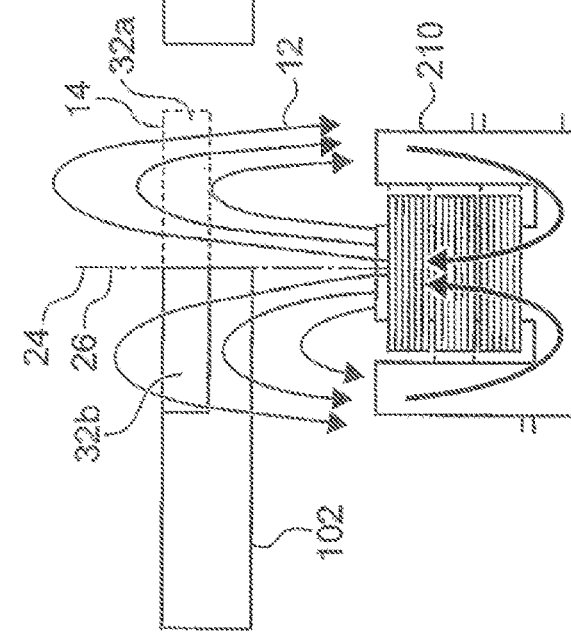

FIGS. 4A, 4B, and 4C are diagrams used to describe correction amounts. Consider the output reduction when the eddy current sensor 210 is aligned with the edge 26 from an energy viewpoint. The farther the position of the eddy current sensor 210, that is, the center 24 of the eddy current sensor 210 is separated outward from the edge 26, the lower the energy that the eddy current 14 induced in the polishing object 102 has is, because the eddy current 14 induced in the polishing object 102 is reduced as the center 24 of the eddy current sensor 210 is separated outward from the edge 26. An amount of the energy reduction of the eddy current 14 is an amount of the energy which is not effectively used (energy loss) in the energy provided by the excitation coil 72. Since the detection coil 73 of the eddy current sensor 210 is considered to detect the magnitude of the eddy current 14, the detection coil 73 is considered to measure the loss amount indirectly.

The energy loss amount is considered to be proportional to a ratio of an area of the polishing object 102 existing in the spot diameter 10 to the whole area of the polishing object 102. When the polishing object 102 exists 100% in the spot diameter 10, the loss amount is 0%. On the contrary, when the polishing object 102 does not exist in the spot diameter 10 at all, the loss amount is 100%. Note that this estimation method is considered to be proper if a surface density of the eddy current 14 induced in the spot diameter 10 is uniform regardless of a position of the eddy current sensor 210.

FIG. 3A described above illustrates a case where the polishing object 102 exists 100% in the spot diameter 10, and FIG. 3B illustrates a case where the polishing object 102 exists 50% in the spot diameter 10. FIG. 4 illustrates a case where the polishing object 102 exists in the spot diameter 10 in various ratios. FIG. 4A illustrates the same case as FIG. 3B, that is, the case where the polishing object 102 exists 50% in the spot diameter 10. That is, when the center 24 of the eddy current sensor 210 is aligned with the edge of the metal film (edge 26), the energy loss (a loss amount 32*a* indicated by a dot line) is half the total energy when there is not any loss. An effective amount 32*b* indicated by a solid line represents the effective energy. The sum of the loss amount 32*a* and the effective amount 32*b* becomes 100%. The loss amount 32*a* and the effective amount 32*b* are equal to each other, and are 50%, respectively.

FIG. 4B illustrates a case where the center 24 of the eddy current sensor 210 is located at a distance 30 inward from the edge 26. At this time, the energy loss amount is a loss amount 34*a* indicated by a dot line. An effective amount 34*b* indicated by a solid line is an effective energy amount. The sum of the loss amount 34*a* and the effective amount 34*b* becomes 100%. FIG. 4C illustrates a case where the center 24 of the eddy current sensor 210 is located at the distance 30 which is the same as that of FIG. 4B outward from the edge 26. At this time, the energy loss amount is a loss amount 36*a* indicated by a dot line. An effective amount 36*b* indicated by a solid line represents the effective energy. The sum of the loss amount 36*a* and the effective amount 36*b* becomes 100%.

When comparing two cases of FIG. 4B and FIG. 4C, since the eddy current sensor 210 is located at the distance 30 inward from the edge 26 in FIG. 4B and at the same distance 30 outward from the edge 26 in FIG. 4C, the loss amount 34*a* and the effective amount 36*b* are considered to be equal to each other. Similarly, the effective amount 34*b* and the loss amount 36*a* are considered to be equal to each other. The following is a summary of the above.

Loss amount 34*a*+effective amount 34*b*=loss amount 36*a*+effective amount 36*b*=100%

Loss amount 34*a*=effective amount 36*b*

Effective amount 34*b*=loss amount 36*a*

When comparing two cases of FIG. 4B and FIG. 4C, the sum of energy loss amounts when the eddy current sensor 210 is located at the distance 30 inward from the edge 26 and when the eddy current sensor 210 is located at the same distance 30 outward from the edge 26 (loss amount 34*a*+loss amount 36*a*) is considered to become 100%. Similarly, the sum of effective amounts when the eddy current sensor 210 is located at these positions (effective amount 34*b*+effective amount 36*b*) is considered to become 100%.

Therefore, as the correcting method, it is necessary to add the effective energy (effective amount 36*b*) when the eddy current sensor 210 is located at the distance 30 outward from the edge 26 to the effective energy (effective amount 34*b*) when the eddy current sensor 210 is located at the distance 30 inward from the edge 26, because the effective amount 36*b*+the effective amount 34*b*=100% and the sum of the effective amount 36*b* and the effective amount 34*b* is equal to 100% which is the output value of the eddy current sensor 210 in FIG. 4A when the eddy current sensor 210 is sufficiently inside the polishing object 102.

Figure 5A:
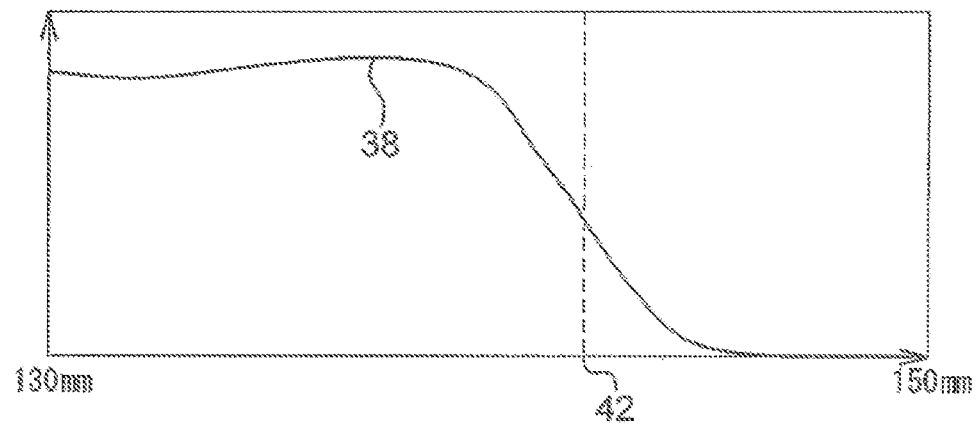
FIGS. 5A, 5B, and 5C are graphical views used to describe a correcting method.
Figure 5B:
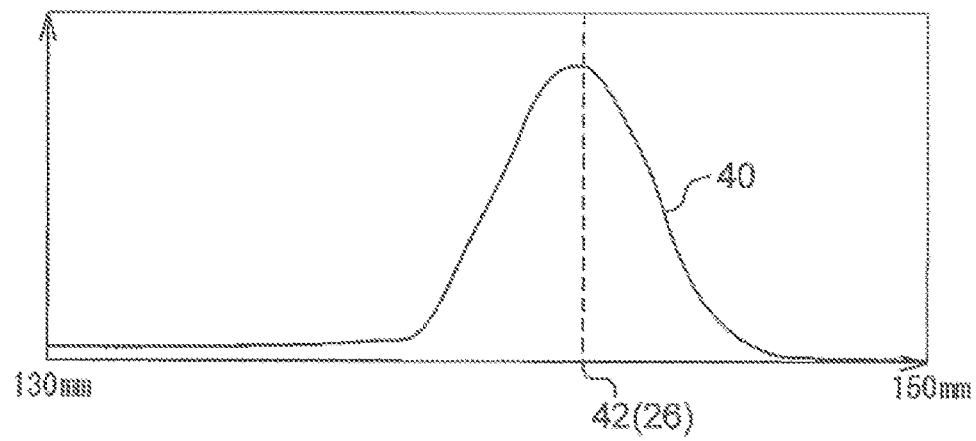
Figure 5C:
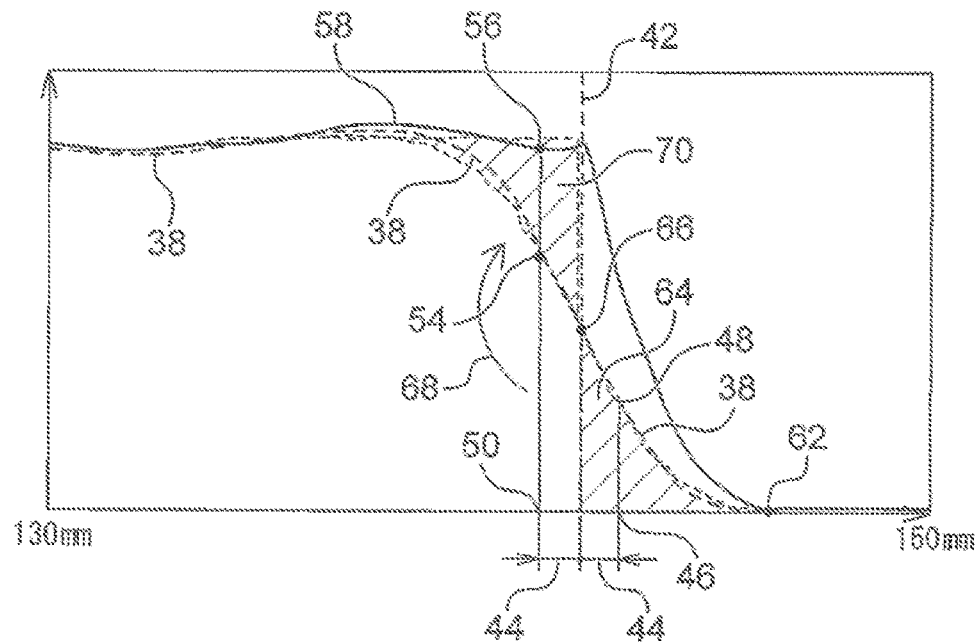

The results obtained by this correction are described with reference to FIG. 5. FIG. 5A is a graphical view showing film thickness data generated by the receiving unit 232. FIG. 5B is a graphical view showing a curve (edge-detecting waveform (F(i))) obtained by differentiating the film thickness data by the estimating unit 234 as described above. FIG. 5C is a graphical view showing the correction method by the correcting unit 238. In these graphical views, the axis of abscissas represents a position measured from a semiconductor wafer center in a radial direction when the polishing object 102 is a circuit on the wafer having an outer diameter of 300 mm. The film thicknesses are represented in a range from 130 mm to 150 mm in radius which is near the edge. The axis of ordinates represents film thickness data in FIG. 5A and FIG. 5C and differences of the film thickness data in FIG. 5B.

A curve 38 shown in FIG. 5A represents the film thickness data generated by the receiving unit 232. The eddy current sensor 210 scans the polishing object 102 linearly. The eddy current sensor 210 scans the polishing object 102 a plurality of times, for example, 50 times to obtain the film thickness data over the whole polishing object 102. As the curve 38, the film thickness data for one-time scanning when the eddy current sensor 210 scans the polishing object 102 one time may be used, or the film thickness data over the whole polishing object 102 obtained by scanning a plurality of times may be used. When the film thickness data over the whole polishing object 102 is used, it is preferable that the film thickness data obtained by averaging pieces of film thickness data obtained by scanning each time is used as the curve 38. In the present embodiment, the curve 38 represents the data obtained by averaging pieces of film thickness data over the whole polishing object 102 at the same radial position. Since the curve 38 is obtained, at an interval of 1 mm in the radial positions of the polishing object 102 for example, it is preferable to obtain the data at 0.1 mm interval narrower than 1 mm interval by spline interpolation. By using the data obtained at a narrower interval, the accuracy of detecting the edge position is improved to thereby improve the accuracy of correction.

A curve 40 shown in FIG. 5B represents difference data obtained by differentiating the curve 38 by the estimating unit 234. The estimating unit 234 detects a peak position 42 of the difference data, and estimates the peak position 42 as a position of the edge 26 of the film thickness data. The estimated peak position 42 (a position of the edge 26 of the film thickness data) approximates to the actual edge position when the measurement error by the eddy current sensor 210 becomes smaller.

A curve 38 indicated by a dot line in FIG. 5C is the curve 38 shown in FIG. 5A before correction. The correction method is as follows. The film thickness data 48 at a position 46 which is located at a distance 44 outward from the peak position 42 is added to the film thickness data 54 at a position 50 which is located at a distance 44 inward from the peak position 42. A curve 58 created by film thickness data 56 obtained by addition represents the film thickness data after correction. The addition is performed up to a point 62 at which the film thickness data becomes "zero." Such corrections can be represented as follows.

The amount to be added by correction is in a region 64 of the curve 38 which is outside from the peak position 42. The region 64 is a region indicated by hatching, and is outside from the peak position 42. When the region 64 is turned by 180 degrees in a direction of an arrow 68 around a point 66 on the curve 38 at the peak position 42, a hatched region 70 can be obtained. The region 64 and the region 70 have the same profile. When the region 70 is added to the curve 38, a corrected curve 58 can be obtained.

Since the region 64 and the region 70 have the same profile, it is understood that a value of the curve 58 at the peak position 42 is twice a value of the curve 38. Therefore, it is preferable that as the corrected curve 58 outside from the peak position 42, the curve 58 is generated by doubling the value of the curve 38 from the viewpoint of maintaining continuity of the curve 58. The corrected curve 58 outside from the peak position 42 shown in FIG. 5C is obtained by doubling the value of the curve 38 before correction.

Figure 6:
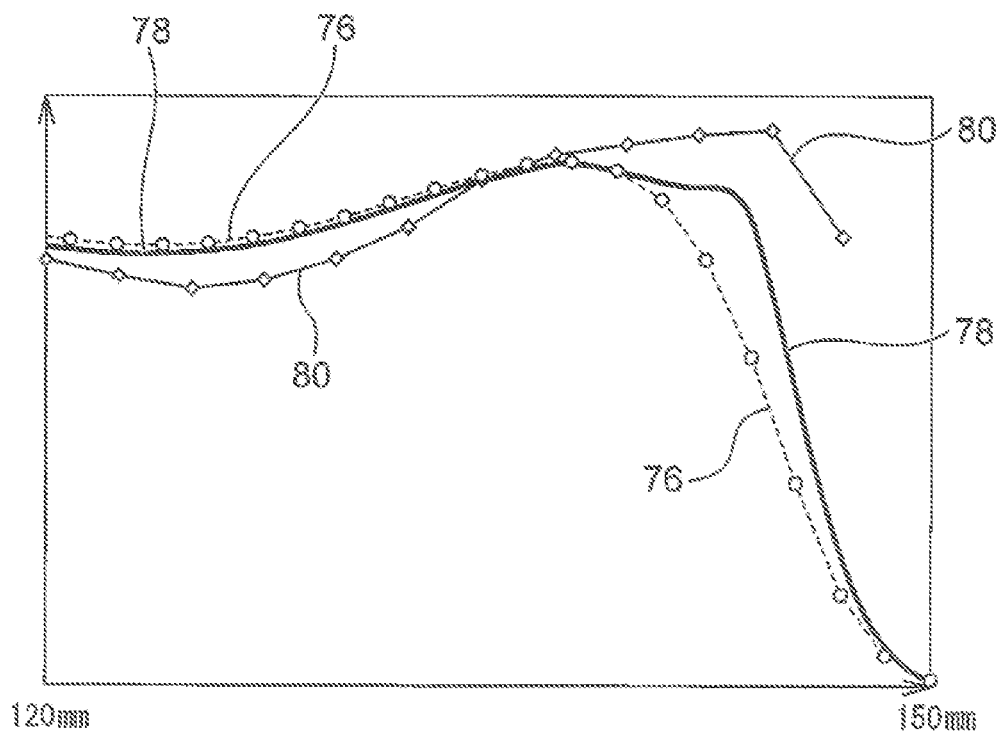
FIG. 6 is a graphical view showing a measurement example of a film thickness when the polishing object 102 is made of tungsten.

FIG. 6 is a graphical view showing an example of actual measurement values obtained by applying the correction method according to the present embodiment. FIG. 6 shows a measurement example of a film thickness when the polishing object 102 is made of tungsten. A curve 76 represents film thicknesses measured by the eddy current sensor 210. A curve 78 represents corrected film thicknesses obtained by applying the correction method according to the present embodiment to the curve 76. A curve 80 represents film thicknesses actually measured using a laser range finder to confirm the validity of the curve 78. In the graphical view, the axis of abscissas represents a position measured from a semiconductor wafer center in a radial direction when the polishing object 102 is a circuit on the wafer having an outer diameter of 300 mm. The film thicknesses are represented in a range from 120 mm to 150 mm in radius which is near the edge. The axis of ordinates represents a film thickness. The axis of ordinates represents the film thickness itself not the film thickness data indicating the squared value of impedance to collate with the actual measurement value of the film thickness.

When comparing between the curve 78 and the curve 80, the corrected curve 78 has a profile nearer to the profile of the curve 80. The correction effect of the present embodiment is apparent, and a difference between the curve 78 and the curve 80 is considered to become smaller. If an effective region of the wafer is increased by about 5 mm in a radial direction by the correction, the effective area can be increased by about 7%. Since it can be considered that this permits the increase in production volume of 7%, the effect of correction is large.

Examples of the embodiments of the present invention have been described above, but the embodiments of the invention described above are provided for easy understanding of the present invention and do not limit the present invention. The present invention may be changed and modified without departing from the scope of the invention, and include equivalents thereof, of course. Moreover, any combination or omission of the components described in Claims and Description may be made in a scope capable of solving at least a part of the above-described problems or in a scope of having at least a part of the effects.

This application claims priority under the Paris Convention to Japanese Patent Application No. 2016-128716 filed on Jun. 29, 2016. The entire disclosure of Japanese Patent Laid-Open No. No. 2005-11977 and Japanese Patent Laid-Open No. 2005-121616 including specification, claims, drawings and summary is incorporated herein by reference in its entirety.

DESCRIPTION OF SYMBOLS

10 . . . Spot diameter
14 . . . Eddy current
26 . . . Edge
42 . . . Peak position
72 . . . Excitation coil
73 . . . Detection coil
74 . . . Balance coil
100 Polishing apparatus
102 Polishing object
108 Polishing pad
110 Polishing table
140 Polishing apparatus control unit
210 Eddy current sensor
230 Film thickness signal processing apparatus
232 Receiving unit
234 Estimating unit
238 Correcting unit
240 Endpoint detector

What is claimed is:

1. A film thickness signal processing apparatus comprising:
    a receiving unit for receiving sensor data that is outputted from a film thickness sensor that detects a film thickness of a polishing object, the receiving unit generating first and second film thickness data; and
    a correcting unit for correcting the first film thickness data in an inside of an edge of the polishing object based on the second film thickness data,
    wherein the receiving unit receives the sensor data that is outputted from the film thickness sensor when center of the film thickness sensor is in the inside of the edge of the polishing object, the receiving unit generating the first film thickness data,
    the receiving unit receives the sensor data that is outputted from the film thickness sensor when a spot for a measure is generated on the polishing object by the film thickness sensor and the center of the film thickness sensor is in an outside of the edge of the polishing object, the receiving unit generating the second film thickness data, and
    the correcting unit corrects the first film thickness data generated by the receiving unit in the inside of the edge of the polishing object using the second film thickness data generated by the receiving unit in the outside of the edge of the polishing object.

2. The film thickness signal processing apparatus according to claim 1, comprising:
    an estimating unit for estimating a position of the edge of the polishing object based on the first and second film thickness data generated by the receiving unit,
    wherein the correcting unit corrects the first film thickness data using the estimated position of the edge.

3. The film thickness signal processing apparatus according to claim 1, wherein
    the correcting unit performs the correction by adding the second film thickness data generated by the receiving unit at a position that is located at a first distance outward from the edge to the first film thickness data generated by the receiving unit at a position that is at a second distance inward from the edge, the first distance and the second distance being equal to each other.

4. A polishing apparatus comprising:
    a polishing table to which a polishing pad for polishing a polishing object is attachable;
    a driving unit capable of rotary-driving the polishing table;
    a holding unit capable of holding and pressing the polishing object against the polishing pad;
    a film thickness sensor disposed in a hole formed in the polishing table, the film thickness sensor being capable of detecting a film thickness of the polishing object during rotation of the polishing table; and
    the film thickness signal processing apparatus according to claim 1.

* * * * *